United States Patent
Babu et al.

(10) Patent No.: US 12,191,672 B2
(45) Date of Patent: Jan. 7, 2025

(54) DEVICES AND METHODS FOR DISCONNECTING A GRID POWER SOURCE FROM AN ELECTRICAL DISTRIBUTION SYSTEM

(71) Applicant: Schneider Electric Industries SAS, Rueil Malmaison (FR)

(72) Inventors: Swardheep Babu, Singapore (SG); Zaixing Wang, Singapore (SG); Benoît Grappe, Voiron (FR); Samuel Kamajaya, Grenoble (FR); Jikang Xu, Singapore (SG)

(73) Assignee: Schneider Electric Industries SAS, Rueil Malmaison (FR)

( * ) Notice: Subject to any disclaimer, the term of this patent is extended or adjusted under 35 U.S.C. 154(b) by 1 day.

(21) Appl. No.: 18/206,227

(22) Filed: Jun. 6, 2023

(65) Prior Publication Data
US 2023/0402851 A1    Dec. 14, 2023

(30) Foreign Application Priority Data

Jun. 10, 2022    (EP) .................................... 22305847

(51) Int. Cl.
*H02J 3/38*    (2006.01)
*H02J 3/00*    (2006.01)
*H02J 3/32*    (2006.01)

(52) U.S. Cl.
CPC ............ *H02J 3/388* (2020.01); *H02J 3/0012* (2020.01); *H02J 3/32* (2013.01); *H02J 2203/10* (2020.01)

(58) Field of Classification Search
CPC .. H02J 5/388; H02J 3/38; H02J 3/0012; H02J 3/32; H02J 2203/10
See application file for complete search history.

(56) References Cited

U.S. PATENT DOCUMENTS

| 2008/0203820 A1* | 8/2008 | Kramer | H02J 3/40 |
| | | | 307/64 |
| 2011/0109161 A1 | 5/2011 | Morishima | |

FOREIGN PATENT DOCUMENTS

| CN | 202616805 U | * 12/2012 |
| EP | 3425767 A1 | 1/2019 |
| EP | 3832831 A1 | 6/2021 |

OTHER PUBLICATIONS

Xavier, Joemoan, "Protection & Control strategy for effectively interconnecting and islanding Distributed Energy Resources during grid disturbances", 2019 72nd Conference for Protective Relay Engineers (CPRE), Mar. 25, 2019, 10 pages.

(Continued)

*Primary Examiner* — Robert L Deberadinis
(74) *Attorney, Agent, or Firm* — Locke Lord LLP

(57) ABSTRACT

An electrical distribution system is configured to supply electric power to an electric load and includes a feeder, a battery energy storage system, an electrical switchgear device and an electronic controller. The switchgear device is configured to selectively connect the connection point to the feeder, wherein the electronic controller is configured to: detect an electric fault representative of a power loss event on the grid power source; upon detecting an electric fault, automatically open the electrical switchgear device to disconnect the grid power source from the feeder; and ensure that the battery system supplies electric power to the electric load while operating in a virtual-synchronous generator control mode.

13 Claims, 3 Drawing Sheets

(56) References Cited

OTHER PUBLICATIONS

European Search Report dated Nov. 24, 2022 for corresponding European Patent Application No. EP22305847.0, 2 pages.

* cited by examiner

DEVICES AND METHODS FOR DISCONNECTING A GRID POWER SOURCE FROM AN ELECTRICAL DISTRIBUTION SYSTEM

TECHNICAL FIELD

The present invention relates to electrical distribution systems and more particularly to devices and methods for disconnecting a grid power source from an electrical distribution system.

BACKGROUND

Many electrical distributions systems used, for example, in residential and industrial applications comprise a battery energy storage system (BESS) capable of storing energy collected from a grid power source (e.g. the mains power grid) and supplying electric power to one or more local electrical loads when the grid power source is not used, for example in case of grid failure.

BESS systems have become increasingly popular in recent years as they facilitate the deployment of decentralized electric generation architectures and systems.

Compared to traditional battery-based back-up power sources, such as uninterruptible power supplies (UPS), BESS are more flexible and can offer hours of operation at nominal power by combining different battery technologies. By contrast, UPS are often designed to deliver nominal power only for a few minutes and can accommodate only one type of battery (most often lead-acid batteries).

Moreover, the autonomy of BESS systems can be increased by coupling additional power sources such as photovoltaic converters. By contrast, UPS are generally unable to be integrated with photovoltaic converters on their AC output.

However, BESS systems usually fail to provide a seamless transition when being disconnected or connected in some specific circumstances.

Generally, a BESS system is connected to the electrical distribution system, usually between the electrical loads and the grid power source. An electrical switchgear device controlled by the BESS system is configured to disconnect the grid power source from the electrical distribution system whenever the BESS system is called upon to supply electricity to the electrical distribution system.

In known BESS systems, in case of sudden grid failure, the switchgear is usually too slow to disconnect the grid power source from the electrical distribution system. This results in a temporary blackout, during which the local electrical loads are not powered, until the BESS system can start operation. Similar problems may arise if the grid is disconnected too rapidly.

This loss of electric power, no matter how short, can have adverse consequences for the electrical loads, especially in critical applications such as industrial processes, computing systems, medical devices and infrastructure, and many others.

There is therefore a need for devices and methods for disconnecting a grid power source from an electrical distribution system, specifically in battery energy storage systems, to ensure a timely disconnection of the grid power source in case of sudden unavailability of the grid power source.

SUMMARY

To that end, the invention relates to electrical distribution system configured to supply electric power to an electric load, the electrical distribution system comprising a feeder for connecting at least one electric load, a battery energy storage system connected to the feeder, and a connection point for connecting a grid power source to the feeder, the battery energy storage system comprising a battery, an electrical switchgear device and an electronic controller, the electrical switchgear device being configured to selectively connect the connection point to the feeder, wherein the electronic controller is configured to implement a virtual-synchronous generator control mode, and wherein the electronic controller is configured to:

detect an electric fault representative of a power loss event on the grid power source, upon detecting an electric fault, automatically open the electrical switchgear device to disconnect the grid power source from the feeder, ensuring that the battery system supplies electric power to the electric load while operating in a virtual-synchronous generator control mode.

In some optional embodiments, detecting an electric fault comprises detecting a voltage vector shift in the voltage delivered by the grid power source.

In some optional embodiments, detecting a voltage vector shift in the voltage delivered by the grid power source comprises:

measuring the duration of each cycle of the voltage for each electrical phase, comparing the duration of the current voltage cycle with the duration of the previous cycle identifying a change voltage vector angle identifying that a power loss condition has occurred of the change of the voltage vector angle exceeds a predefined threshold angle value.

In some optional embodiments, the threshold angle is comprised in an interval between 5° and 10°.

In some optional embodiments, opening the electrical switchgear device to disconnect the grid power source from the feeder and activate the battery system to supply electric power to the electric load using the battery are performed simultaneously or concurrently.

In some optional embodiments, the battery energy storage system is configured to remain in the virtual-synchronous generator control mode.

In some optional embodiments, after activating the battery system to supply electric power to the electric load using the battery, the battery system is configured to operate in a grid-forming mode.

In some optional embodiments, the electronic controller is also configured to reconnect the system to the grid power source when power is restored to the grid power source after a power loss event.

According to another aspect, the invention relates to a method for disconnecting a grid power source from an electrical distribution system configured to supply electric power to an electric load, the electrical distribution system comprising a feeder for connecting at least one electric load, a battery energy storage system connected to the feeder, and a connection point for connecting a grid power source to the feeder, the battery energy storage system comprising a battery, an electrical switchgear device and an electronic controller, the electrical switchgear device being configured to selectively connect the connection point to the feeder, wherein the electronic controller is configured to implement a virtual-synchronous generator control mode, and comprising:
    detecting an electric fault,
    upon detecting an electric fault, automatically opening the electrical switchgear device to disconnect the grid power source from the feeder,
    ensuring that the battery system supplies electric power to the electric load while operating in a virtual-synchronous generator control mode.

BRIEF DESCRIPTION OF THE DRAWINGS

The invention will be understood upon reading the following description, provided solely as an example, and made in reference to the appended drawings, in which.

It should be noted that the drawings may not necessarily be to scale and certain features may be shown in schematic form.

DETAILED DESCRIPTION OF SOME EMBODIMENTS

Figure 1:
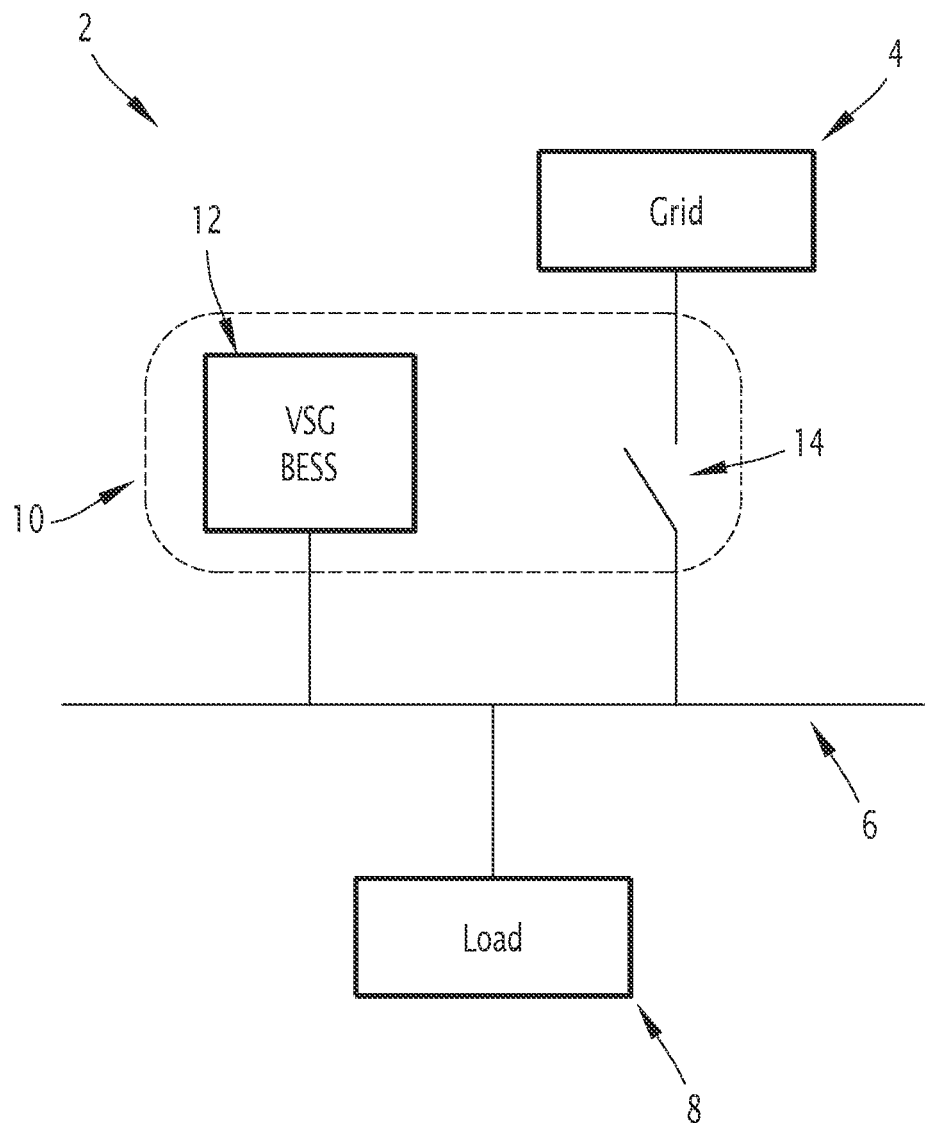
FIG. 1 is a simplified diagram of an electrical system according to an exemplary embodiment of the invention.

FIG. 1 illustrates an electrical distribution system 2 configured to receive electric power from a grid power source 4, such as a mains grid.

The system 2 comprises one or more electric feeders 6 for distributing electric power 6 to one or more electrical loads 8.

For example, each feeder 6 comprises one or more electric conductors, such as electric cables or bus bars or the like.

Each feeder 6 is configured to carry an electric current, e.g. a three-phase alternating current (AC), or a three-phase AC system with a neutral line.

The system 2 comprises at least one connection point for connecting a grid power source 4 to the feeder.

The electrical loads 8 may comprise electrical machines such as rotating machines, mechanical and/or electrical equipment, electronic devices, lighting devices, and the like, these examples being given only for illustrative purposes.

In the illustrated example, only one feeder 6 and one electrical load 8 are visible, but in practice many alternative embodiments are possible and the number of feeders 6 and/or loads 8 can be different.

The system 2 comprises a battery energy storage system 10 (BESS).

In many embodiments, storage system 10 comprises one or more electric batteries and a power converter, such as a battery inverter (e.g. a DC-to-AC converter) electrically connected to terminals of the electric batteries.

For example, the batteries may comprise nickel-metal-hydride batteries cells, lithium-ion batteries cells, lead-acid batteries or any other suitable electrochemical battery.

The power converter may comprise one or more inverter switches controlled by an electronic controller.

The storage system 10 comprises an electronic controller 12 configured to oversee operation of the storage system 10, and more specifically for controlling the storage system 10 in different modes of operation, such as grid forming, grid tie, or virtual-synchronous generator. Preferably, the electronic controller 12 is configured to implement a virtual-synchronous generator (VSG) control mode.

In some embodiments, the electronic controller 12 comprises a processor.

For example, the expression "processor" may refer to electronic controller devices including a microprocessor or a microcontroller, and to other equivalent devices such as programmable logic controllers (PLC), application-specific integrated (ASIC) circuits, field-programmable gate array (FGPA) circuits, logic circuits, analog circuitry, equivalents thereof, and any other circuit or processor capable of executing the functions described herein. The method(s) or algorithm(s) described in connection with the embodiments disclosed herein may be embodied directly in hardware, in software code executed by the processor, or in a combination of the two.

Preferably, the storage system 10 is connected to the electrical distribution system between the electrical loads and the grid power source.

In addition, the system 2 may comprise an additional electronic controller (not illustrated) configured to oversee operation of the switch 14 and comprising a processor.

As explained previously, the expression "processor" may refer to electronic controller devices including a microprocessor or a microcontroller, and to other equivalent devices such as programmable logic controllers (PLC), application-specific integrated (ASIC) circuits, field-programmable gate array (FGPA) circuits, logic circuits, analog circuitry, equivalents thereof, and any other circuit or processor capable of executing the functions described herein. The method(s) or algorithm(s) described in connection with the embodiments disclosed herein may be embodied directly in hardware, in software code executed by the processor, or in a combination of the two.

In some embodiments, the electronic controller 12 and the electronic controller responsible for the operation of the switchgear device 14 may be part of a same electronic control unit.

The storage system 10 comprises an electrical switchgear device 14 connected between the electrical loads 8 and the power source 4. The electrical switchgear device 14 is configured to selectively connect the connection point to the feeder, for example due to its position between the feeder and the power source 4.

In other words, the grid power source 4 can be connected to the feeder 6 only through the electrical switchgear device 14.

The electrical switchgear device 14 can be reversibly switched between an open position, in which current is prevented from flowing between the feeder 6 and the grid 4, and a closed position, in which electric current can flow between the feeder 6 and the grid 4.

For example, the switchgear device 14 is an electromechanical switch such as a relay, or a motorized breaker, or a contactor, or any equivalent device.

In other embodiments, the switchgear device 14 is a semiconductor switch, such as a power transistor, or any suitable electronically controllable switch.

For example, a control terminal of the switchgear device 14 is connected to a signal output of the electronic controller responsible for the operation of the switchgear device 14.

The electronic controller connected to the switchgear device 14 is configured to disconnect the grid source 4 from the distribution system 2 whenever the storage system 10 is called upon to supply electricity to the system 2, for example, when the grid source 4 is unavailable.

In preferred embodiments, the system 10 is capable of operating in at least two modes of operation: a grid connected mode and grid disconnected mode.

In the grid connected mode (e.g. in grid-tied mode), the grid source 4 is connected to the distribution system 2 and the electrical switchgear device 14 is closed.

Preferably, the system 10 is coupled to the grid 4 and synchronized with the grid 4.

For example, the operating frequency of the system 10, such as the frequency of the inverter, is synchronized with the operating frequency of the grid 4. The system 10 may use the electric power supplied by the power grid 4 to recharge the batteries.

In the disconnected mode, the grid source 4 is connected to the distribution system 2 and the electrical switchgear device 14 is opened. The storage system 10 is used to supply electric power by using the energy stored in the batteries.

The distribution system 2 may be operated in a so called grid-forming mode to ensure that the loads 8 are powered. For example, in the grid forming mode, the system 10 may supply electric power with a specific frequency and/or voltage amplitude.

The electronic controller 12 may be configured to selectively disconnect the grid source 4 from the electrical distribution system 2 whenever the storage system 10 is called upon to supply electricity to the system 2, for example when the grid source 4 is unavailable.

According to embodiments, the electronic controller responsible for the operation of the switchgear device 14 is configured to:
  detect an electric fault representative of a power loss event on the grid power source 4,
  upon detecting an electric fault, automatically open the electrical switchgear device 14 to disconnect the grid power source from the feeder 6,
  ensuring that the battery system 10 supplies electric power to the electric load(s) 8 using the battery, preferably while operating in a virtual-synchronous generator control mode.

Preferably, the steps of opening the electrical switchgear device to disconnect the grid power source from the feeder and activate the battery system to supply electric power to the electric load using the battery are performed simultaneously or concurrently.

An objective of the invention is to provide backup power with the battery system 10 in the event of a power loss from the grid source 4 with a reaction time fast enough to prevent a blackout, which would have adverse consequences for the loads 8.

For example, the reaction time (e.g., the time between the occurrence of a power loss event and the disconnection of the grid source 4) is lower than 100 milliseconds (ms) or lower than 50 ms, and preferably seamless (ie no power loss at all).

In preferred embodiments, the electronic controller 12 is configured to detect said power loss event by identifying a voltage vector shift in the voltage delivered by the grid power source 4.

Relying on the voltage vector shift is advantageous because the voltage vector shift occurs when there is an active power unbalance between local power generation and local power consumption (by the electrical loads). Electrical protections based on the voltage vector shift are faster than any other protection means and more accurate to identify a power loss event (loss of mains event) especially in a system with battery.

In practice, for detecting the power loss event, the voltage vector shift detection condition can be supplemented by one or more other detection conditions such as the rate of change of frequency (e.g. a rate of change of the voltage frequency) and/or undervoltage conditions (e.g. when the voltage amplitude moves below a predefined voltage threshold).

For example, the system 10 comprises a voltage vector shift relay and/or another protection relay function such as an undervoltage protection relay or a RoCoF (Rate of Change of Frequency) protection relay.

An output of the voltage vector shift relay may be connected to the electronic controller responsible for the operation of the switchgear device 14.

Alternatively, the system 10 may comprise one or more sensors, such as current sensors and/or voltage sensors, connected to the electronic controller 12 and/or the electronic controller responsible for the operation of the switchgear device 14.

For example, during operation, the duration of each cycle of the voltage is measured for each phase. The duration of the current voltage cycle is compared with the duration of the previous cycle, which is considered as a reference value. For example, in a 50 Hz AC voltage system, the duration of each voltage cycle is equal to 20 ms.

In case of a power loss event, when the system 2 is islanded, i.e. separated from the mains grid source 4, the cycle duration is longer since there is a deficit of active power in the system. The cycle duration can also be shorter, if there an excess of active power in the system. Either way, the sudden change causes a change in the voltage vector angle.

The loss of power supplied by the grid source 4 causes a significant drop of power delivered to the feeder 6 (and to the load(s) 8). As a result, a sudden voltage vector shift appears.

In the meaning of the present description, a voltage vector shift refers to a change in the phase angle of a phase vector representative of the voltage signal of at least one of the electric phases of the system 2.

Figure 2:
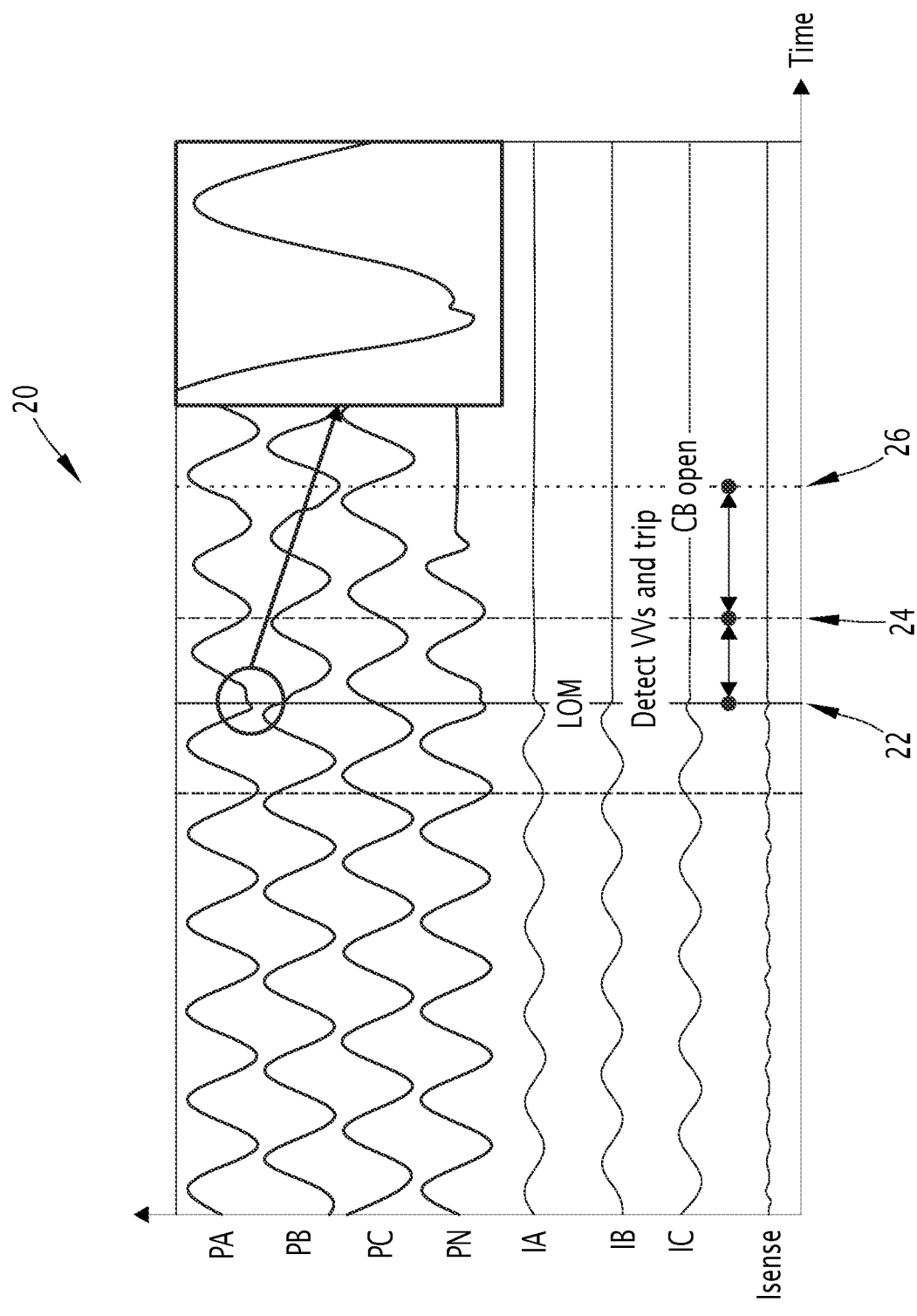
FIG. 2 is a graph illustrating an example of operation of the electrical system of FIG. 1.

FIG. 2 illustrates an example of voltage and current waveforms during a fault for an exemplary three-phase AC system with a neutral line.

On the illustrated example of FIG. 2, the graphs PA, PB, PC illustrate respectively the voltage amplitude (y-axis) over time (x-axis) of the first AC electrical phase, the second AC electrical phase and the third AC electrical phase.

The graph PN illustrate the voltage associated to the neutral line over time (x-axis).

The graphs IA, IB, IC illustrate respectively the electric current measured in the first AC electrical phase, the second AC electrical phase and the third AC electrical phase as a function of time (x-axis).

The graph Isense illustrates the sum of electric currents IA, IB, IC and is shown only for explanatory purposes. In some embodiments, Isense may be used for system earthing electrical protections, which however are independent from the invention. Measuring or determining Isense is not required by the invention.

In the example of FIG. 2, the vector shift appears as a dent in one of the phase voltages (see reference 20 and top-right insert).

The electronic controller the electronic controller responsible for the operation of the switchgear device 14 is configured to automatically open the switchgear device 14 is the voltage vector shift exceeds a predefined threshold angle value.

For example, the threshold angle is comprised in an interval between 5° and 10°.

Preferably, the angle setting is determined by the load size. For example, for a small installation (e.g. comprising few electrical loads), the threshold angle needs to be configured as being more sensitive than in a large scale facility.

The precise value of the threshold angle can be fine-tuned depending on the specific properties of the system 2 during a commissioning phase.

With this configuration, the reaction time can be fast enough to provide backup power before various protection devices can detect the power loss event and cause the system 10 to go into a default mode, in which no power could be delivered to the loads 8 (a situation which is to be avoided), as visible on FIG. 2. These protection devices are likely to detect under/over voltage conditions and/or a current backfeed to grid.

It is therefore preferable to open the switchgear device 14 and activate the system 10 before these conditions can be detected by the protection devices.

For example, after the power loss event (event 22, noted LOM, for "loss of mains"), the electronic controller responsible for the operation of the switchgear device 14 detects the fault, opens the switch 14 (event 24, "Detects voltage vector (VV) shift and trip") and restores backup power before other protection devices such as current breakers (CB) can trip and shut down the system 10 (event 26, "CB open").

The total reaction time depends on the time needed to detect the power loss event, and also on the time required by the switchgear device 14 to completely disconnect the grid 4 from the feeder 6. Preferably, the switchgear device 14 is a fast switch.

For example, the virtual-synchronous generator control mode emulates the dynamics of the rotation synchronous generator and enhances the stability of the power system.

This offers several advantages during operation, among which ensuring that no power from the system 10 will back feed to the grid source 4, potentially causing a situation in which the maximum output power would be smaller than the total electric power of the loads (for the system 10 would then enter into a default mode and cease operation.

Another advantage is to ensure a better security during recovery (e.g. when the switch 14 is reconnected when the grid source 4 is restored), for example by integrating a synchronization-check function.

In some embodiments, the battery energy storage system 10 is configured to remain in the virtual-synchronous generator control mode, e.g. to share the load power supply with the grid when grid-connected and to provide all the load power supply when the grid has failed and has been disconnected from the system 2. The battery energy storage system 10 may remain in the virtual-synchronous generator control mode in parallel with the mains grid as long as the local grid allows it.

In many embodiments, preferably, the electronic controller the electronic controller responsible for the operation of the switchgear device 14 is also configured to reconnect the system 2 to the grid source 4 (e.g. by closing the switch 14), for example when power is restored to the grid source 4.

For example, during reconnection, the electronic controller 12 may automatically synchronize the system 2 with the grid 4 in case of grid recover, in order to gradually share the load power supply with the grid 4 and return the grid-connected mode.

Figure 3:
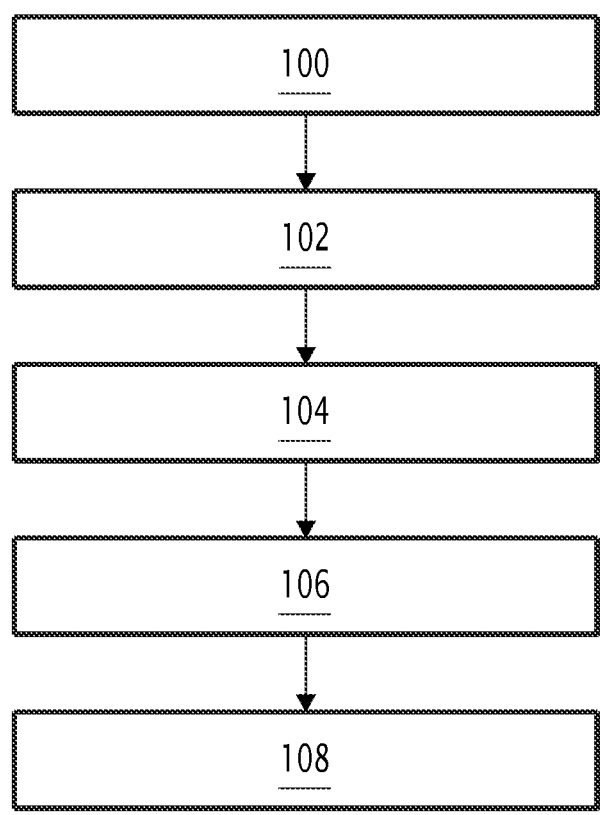
FIG. 3 is a diagram illustrating a method of operation of the electrical system of FIG. 1.

An example of operation is now described in reference to FIG. 3.

The methods initially begins (block 100) when the grid source 4 is in operation.

The switchgear device 14 is closed, allowing the grid source 4 to supply electric power to the feeder 6. The system 10 is coupled to the grid source 4 and operates synchronized with the grid 4 (e.g., with synchronized frequencies).

A power loss event then occurs in the grid source 4.

At block 102, the electronic controller 12 detects an electric fault representative of a power loss event on the grid power source.

At block 104, upon detecting the electric fault, and preferably immediately upon detecting the electric fault, the electronic controller 12 automatically opens the electrical switchgear device 14 to disconnect the grid power source 4 from the feeder 6.

At block 106, the electronic controller 12 ensures (106) that the battery system supplies electric power to the electric load while operating in a virtual-synchronous generator control mode.

Preferably, the battery system 10 operates in a grid-forming mode.

Optionally, at block 108, the electronic controller 12 automatically reconnects the system 2 to the grid power source 4, for example when power is restored to the grid power source 4 after the power loss event.

For example, the system 10 returns the grid-connected mode and synchronizes operation with the grid source 4.

In many alternative embodiments, the method steps described above can be executed in a different order. One or more method steps could be omitted or replaced by equivalent steps. One or more method steps could be combined or dissociated into different method steps. The disclosed exemplary embodiment is not intended to be limiting and does not prevent other methods steps to be executed without departing from the scope of the claimed subject matter.

The embodiments and alternatives described above may be combined with each other in order to create new embodiments of the invention within the scope of the claims.

The invention claimed is:

1. An electrical distribution system configured to supply electric power to an electric load, the electrical distribution system comprising a feeder for connecting at least one electric load, a battery energy storage system connected to the feeder, and a connection point for connecting a grid power source to the feeder, the battery energy storage system comprising a battery, an electrical switchgear device and an electronic controller, the electrical switchgear device being configured to selectively connect the connection point to the feeder, wherein the electronic controller is configured to implement a virtual-synchronous generator control mode, and wherein the electronic controller is configured to:
   detect an electric fault representative of a power loss event on the grid power source,
   upon detecting an electric fault, automatically open the electrical switchgear device to disconnect the grid power source from the feeder, and
   ensure that the battery energy storage system supplies electric power to the electric load while operating in a virtual-synchronous generator control mode,
   wherein detecting an electric fault comprises detecting a voltage vector shift in voltage delivered by the grid power source, and
   wherein detecting the voltage vector shift in the voltage delivered by the grid power source comprises:
   measuring a duration of each cycle of the voltage delivered by the grid power source for each electrical phase, comparing a duration of a current voltage cycle with a duration of a previous voltage cycle, identifying a change in a voltage vector angle, and identifying that a power loss condition has occurred if the change of the voltage vector angle exceeds a predefined threshold angle value.

2. The electrical distribution system according to claim 1, wherein the threshold angle is comprised in an interval between 5° and 10°.

3. The electrical distribution system according to claim 1, wherein the electronic controller is further configured to activate the battery energy storage system to supply electric power to the electric load using the battery, and wherein opening the electrical switchgear device to disconnect the grid power source from the feeder and activating the battery energy storage system to supply electric power to the electric load using the battery are performed simultaneously or concurrently.

4. The electrical distribution system according to claim 1, wherein the battery energy storage system is configured to remain in the virtual-synchronous generator control mode.

5. The electrical distribution system according to claim 1, wherein the electronic controller is further configured to activate the battery energy storage system to supply electric power to the electric load using the battery, and wherein, after activating the battery energy storage system to supply electric power to the electric load using the battery, the battery energy storage system is configured to operate in a grid-forming mode.

6. The electrical distribution system according to claim 1, wherein the electronic controller is also configured to reconnect the electrical distribution system to the grid power source when power is restored to the grid power source after a power loss event.

7. A method for disconnecting a grid power source from an electrical distribution system configured to supply electric power to an electric load, the electrical distribution system comprising a feeder for connecting at least one electric load, a battery energy storage system connected to the feeder, and a connection point for connecting a grid power source to the feeder, the battery energy storage system comprising a battery, an electrical switchgear device and an electronic controller, the electrical switchgear device being configured to selectively connect the connection point to the feeder, wherein the electronic controller is configured to implement a virtual-synchronous generator control mode, and comprising:

detecting an electric fault, upon detecting an electric fault, automatically opening the electrical switchgear device to disconnect the grid power source from the feeder, and ensuring that the battery energy storage system supplies electric power to the electric load while operating in a virtual-synchronous generator control mode, wherein detecting an electric fault comprises detecting a voltage vector shift in voltage delivered by the grid power source, and wherein detecting the voltage vector shift in the voltage delivered by the grid power source comprises:

measuring a duration of each cycle of the voltage delivered by the grid power source for each electrical phase, comparing a duration of a current voltage cycle with a duration of a previous voltage cycle, identifying a change in a voltage vector angle, and identifying that a power loss condition has occurred if the change of the voltage vector angle exceeds a predefined threshold angle value.

8. The method according to claim 7, wherein the threshold angle is comprised in an interval between 5° and 10°.

9. The method according to claim 7, further comprising activating the battery energy storage system to supply electric power to the electric load using the battery, and wherein opening the electrical switchgear device to disconnect the grid power source from the feeder and activating the battery energy storage system to supply electric power to the electric load using the battery are performed simultaneously or concurrently.

10. The method according to claim 7, wherein the battery energy storage system is configured to remain in the virtual-synchronous generator control mode.

11. The method according to claim 7, further comprising activating the battery energy storage system to supply electric power to the electric load using the battery, and wherein, after activating the battery energy storage system to supply electric power to the electric load using the battery, the battery energy storage system is configured to operate in a grid-forming mode.

12. The method according to claim 7, further comprising reconnecting the electrical distribution system to the grid power source when power is restored to the grid power source after a power loss event.

13. A computer program product comprising a non-transitory computer-readable medium having computer-executable code stored thereon, which when executed by a processor, causes the method according to claim 7 to be performed.

* * * * *